US012662739B2

(12) United States Patent
Huang et al.

(10) Patent No.: US 12,662,739 B2
(45) Date of Patent: Jun. 23, 2026

(54) SURFACE-MODIFIED ALUMINUM ALLOY SUBSTRATE STRUCTURE

(71) Applicant: AMULAIRE THERMAL TECHNOLOGY, INC., New Taipei City (TW)

(72) Inventors: Yi-Hsin Huang, New Taipei City (TW); Ching-Ming Yang, New Taipei City (TW); Kuo-Wei Lee, New Taipei City (TW); Tze-Yang Yeh, New Taipei City (TW)

(73) Assignee: AMULAIRE THERMAL TECHNOLOGY, INC., New Taipei City (TW)

( * ) Notice: Subject to any disclaimer, the term of this patent is extended or adjusted under 35 U.S.C. 154(b) by 307 days.

(21) Appl. No.: 18/396,617

(22) Filed: Dec. 26, 2023

(65) Prior Publication Data

US 2025/0207263 A1 Jun. 26, 2025

(51) Int. Cl.
*B32B 15/20* (2006.01)
*B32B 15/01* (2006.01)
(Continued)

(52) U.S. Cl.
CPC .......... *C23C 28/021* (2013.01); *B32B 15/016* (2013.01); *B32B 15/017* (2013.01); *B32B 15/04* (2013.01); *B32B 15/043* (2013.01); *B32B 15/20* (2013.01); *C23C 14/16* (2013.01); *C23C 14/165* (2013.01); *C23C 28/023* (2013.01); *C23C 30/00* (2013.01); *C23C 30/005* (2013.01); *C22C 21/02* (2013.01); *C22C 21/08* (2013.01); *Y10T 428/12736*

(2015.01); *Y10T 428/12764* (2015.01); *Y10T 428/12792* (2015.01); *Y10T 428/12903* (2015.01);
(Continued)

(58) Field of Classification Search
CPC ..... C23C 28/021; C23C 28/023; C23C 14/16; C23C 14/165; C23C 30/00; C23C 30/005; C22C 21/02; C22C 21/08; B32B 15/016; B32B 15/017; B32B 15/04; B32B 15/043; B32B 15/20; Y10T 428/12736; Y10T 428/12764; Y10T 428/12903; Y10T 428/12944; Y10T 428/12792; Y10T 428/265; Y10T 428/26; Y10T 428/24942; Y10T 428/2495
See application file for complete search history.

(56) References Cited

U.S. PATENT DOCUMENTS

2002/0086179 A1* 7/2002 Wittebrood ........... B32B 15/017
428/654

FOREIGN PATENT DOCUMENTS

CN 1615204 A 5/2005
CN 111712349 A 9/2020
(Continued)

*Primary Examiner* — Michael E. La Villa
(74) *Attorney, Agent, or Firm* — Li & Cai Intellectual Property Office

(57) ABSTRACT

A surface-modified aluminum alloy substrate structure includes a 6000-Series aluminum alloy substrate, a diffusion buffer layer, and a meltable metallic layer. The diffusion buffer layer is formed on the 6000-Series aluminum alloy substrate for buffering magnesium in the 6000-Series aluminum alloy substrate from diffusing to a meltable metallic layer. The meltable metallic layer is formed on the diffusion buffer layer for being melted in a subsequent process.

7 Claims, 2 Drawing Sheets

(51) Int. Cl.

| | | |
|---|---|---|
| *B32B 15/04* | (2006.01) | |
| *C23C 14/16* | (2006.01) | |
| *C23C 28/02* | (2006.01) | |
| *C23C 30/00* | (2006.01) | |
| C22C 21/02 | (2006.01) | |
| C22C 21/08 | (2006.01) | |

(52) U.S. Cl.
CPC .................. *Y10T 428/12944* (2015.01); *Y10T 428/24942* (2015.01); *Y10T 428/2495* (2015.01); *Y10T 428/26* (2015.01); *Y10T 428/265* (2015.01)

(56)                   References Cited

FOREIGN PATENT DOCUMENTS

| | | |
|---|---|---|
| CN | 217167057 U | 8/2022 |
| WO | WO2023015071 A1 | 2/2023 |

* cited by examiner

SURFACE-MODIFIED ALUMINUM ALLOY SUBSTRATE STRUCTURE

FIELD OF THE DISCLOSURE

The present disclosure relates to aluminum alloy, and more particularly to a surface-modified aluminum alloy substrate structure.

BACKGROUND OF THE DISCLOSURE

Aluminum alloy is the most widely used metal material in the industry. Aluminum alloy has the advantages of low density, high strength, high thermal conductivity, and good processing performance. With the application of aluminum alloy in aerospace, automobiles, machinery manufacturing, etc., the requirements for the brazing performance of aluminum alloy continue to increase. The quality of brazing will directly affect the use of components.

6000-Series aluminum alloy is the most widely used aluminum alloy, and has good strength and corrosion resistance. The main element that has the reinforcement function in 6000-Series aluminum alloy is magnesium (Mg). However, an excessively high content of magnesium in 6000-Series aluminum alloy may be one of the reasons for poor brazing, such that a bonding yield cannot be guaranteed.

SUMMARY OF THE DISCLOSURE

In response to the above-referenced technical inadequacies, the present disclosure provides a surface-modified aluminum alloy substrate structure.

In order to solve the above-mentioned problems, one of the technical aspects adopted by the present disclosure is to provide a surface-modified aluminum alloy substrate structure, which includes: a 6000-Series aluminum alloy substrate; a diffusion buffer layer formed on the 6000-Series aluminum alloy substrate for buffering magnesium in the 6000-Series aluminum alloy substrate from diffusing to a meltable metallic layer; and a meltable metallic layer formed on the diffusion buffer layer for being melted in a subsequent process.

In one of the possible or preferred embodiments, the diffusion buffer layer is made of one of a 3000-Series aluminum alloy and a 1000-Series aluminum alloy.

In one of the possible or preferred embodiments, the diffusion buffer layer is a thin layer formed on the 6000-Series aluminum alloy substrate by rolling and has a thickness of 1 mm or less.

In one of the possible or preferred embodiments, the meltable metallic layer is an aluminum-silicon alloy layer.

In one of the possible or preferred embodiments, the meltable metallic layer is a thin layer formed on the diffusion buffer layer by rolling and has a thickness of 0.3 mm or less.

In order to solve the above-mentioned problems, another one of the technical aspects adopted by the present disclosure is to provide a surface-modified aluminum alloy substrate structure, which includes: a 6000-Series aluminum alloy substrate; a diffusion buffer layer formed on the 6000-Series aluminum alloy substrate for buffering magnesium in the 6000-Series aluminum alloy substrate from diffusing to a meltable metallic layer; a meltable metallic layer formed on the diffusion buffer layer for being melted in a subsequent process; and a brazing promotion layer formed on the meltable metallic layer for enhancing a eutectic reaction.

In one of the possible or preferred embodiments, the diffusion buffer layer is made of one of a 3000-Series aluminum alloy and a 1000-Series aluminum alloy.

In one of the possible or preferred embodiments, the diffusion buffer layer is a thin layer formed on the 6000-Series aluminum alloy substrate by rolling and has a thickness of 1 mm or less.

In one of the possible or preferred embodiments, the meltable metallic layer is an aluminum-silicon alloy layer.

In one of the possible or preferred embodiments, the meltable metallic layer is a thin layer formed on the diffusion buffer layer by rolling and has a thickness of 0.3 mm or less.

In one of the possible or preferred embodiments, the brazing promotion layer is made of an alloy that includes copper, nickel and zinc.

In one of the possible or preferred embodiments, the brazing promotion layer is an extremely thin layer formed on the meltable metallic layer by rolling and has a thickness of 0.005 mm or less.

In one of the possible or preferred embodiments, the brazing promotion layer is an extremely thin layer formed on the meltable metallic layer by physical vapor deposition and has a thickness of 0.005 mm or less.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
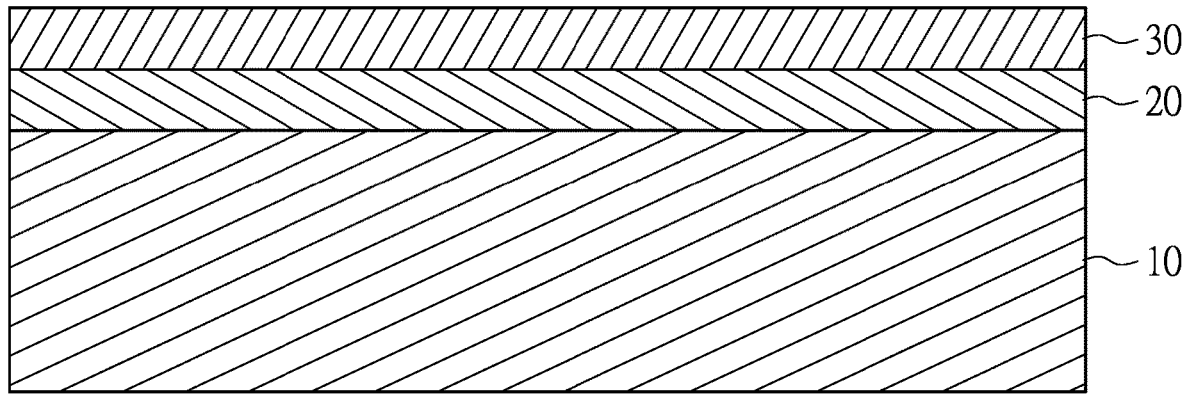
FIG. 1 is a schematic side view of a surface-modified aluminum alloy substrate structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which shows the first embodiment of the present disclosure. The present embodiment of the present disclosure provides a surface-modified aluminum alloy substrate structure. The surface-modified aluminum alloy substrate structure provided in the present embodiment of the present disclosure includes a 6000-Series aluminum alloy substrate 10, a diffusion buffer layer 20, and a meltable metallic layer 30.

The 6000-Series aluminum alloy substrate 10 contains a magnesium element. The 6000-Series aluminum alloy substrate 10 reinforced by the magnesium element has a strength stronger than those of a 3000-Series aluminum alloy and a 1000-Series aluminum alloy that are not reinforced by the magnesium element.

Further, the 6000-Series aluminum alloy substrate 10 can be made of 6061 or 6063 aluminum alloy, but the present disclosure is not limited thereto.

The diffusion buffer layer 20 is formed on the 6000-Series aluminum alloy substrate 10, and the diffusion buffer layer 20 can be used to alleviate diffusion of magnesium in the 6000-Series aluminum alloy substrate 10, so that poor brazing caused by the diffusion of magnesium can be avoided. In this way, the effect of not using a flux during brazing can be achieved.

Furthermore, the diffusion buffer layer 20 may be made of a 3000-Series aluminum alloy or a 1000-Series aluminum alloy, and the diffusion buffer layer 20 is a thin layer formed on the 6000-Series aluminum alloy substrate 10 by rolling. Specifically, the diffusion buffer layer 20 is a thin layer formed on the 6000-Series aluminum alloy substrate 10 by rolling, and has a thickness of 1 mm or less to avoid the obvious reduction in thermal conductivity if the thickness exceeds 1 mm, so that the diffusion buffer layer 20 can achieve both weldability and thermal conductivity. In addition, in order to further guarantee that the diffusion buffer layer 20 can achieve both weldability and thermal conductivity, the diffusion buffer layer 20 can be a thin layer formed on the 6000-Series aluminum alloy substrate 10 by rolling and have a thickness of 0.5 mm.

The meltable metallic layer 30 is formed on the diffusion buffer layer 20, and a melting point of the meltable metallic layer 30 is lower than a melting point of the diffusion buffer layer 20 and a melting point of the 6000-Series aluminum alloy substrate 10, so that the meltable metallic layer 30 is a low melting point metal layer that can be used to replace filler.

In addition, the meltable metallic layer 30 may be an aluminum-silicon alloy layer, which is used for being melted in a subsequent process and can replace the filler. In detail, the meltable metallic layer 30 may be made of a 4000-Series aluminum alloy, and is preferably made of 4045 or 4047 aluminum alloy. The meltable metallic layer 30 is also a thin layer formed on the diffusion buffer layer 20 by rolling. Specifically, the meltable metallic layer 30 is a thin layer formed on the diffusion buffer layer 20 by rolling and has a thickness of 0.3 mm or less, so as to prevent excessive residual materials from overflowing after the meltable metallic layer 30 is melted. Moreover, in order to more reliably enable the meltable metallic layer 30 to replace the filler and avoid excessive overflow of the residual materials after the meltable metallic layer 30 is melted, the meltable metallic layer 30 is a thin layer formed on the diffusion buffer layer 20 by rolling and has a thickness of between 0.05 mm and 0.3 mm.

Second Embodiment

Figure 2:
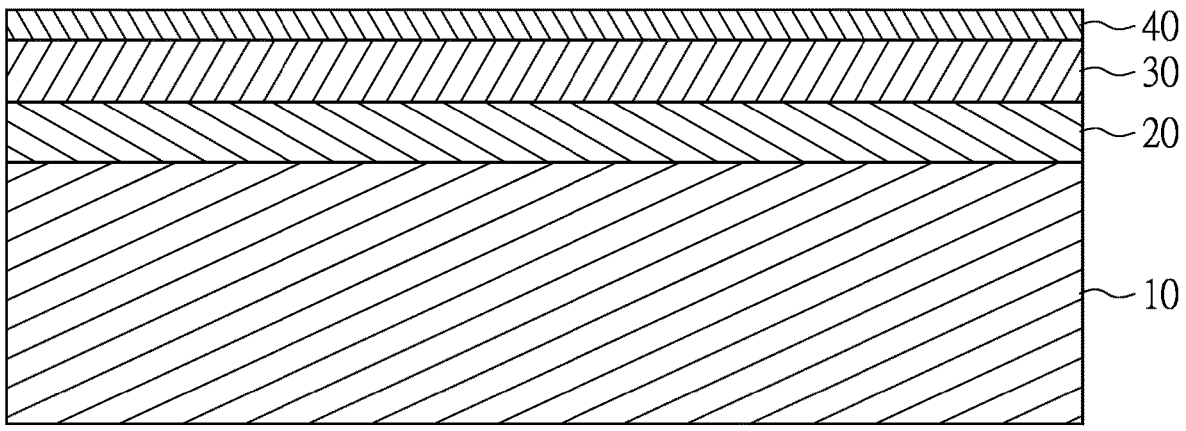
FIG. 2 is a schematic side view of a surface-modified aluminum alloy substrate structure according to a second embodiment of the present disclosure.

Reference is made to FIG. 2, which shows the second embodiment of the present disclosure. The present embodiment is substantially the same as the first embodiment, and the differences are explained as follows.

In the present embodiment, the surface-modified aluminum alloy substrate includes a 6000-Series aluminum alloy substrate 10, a diffusion buffer layer 20, and a meltable metallic layer 30. Furthermore, the surface-modified aluminum alloy substrate further includes a brazing promotion layer 40 formed on the meltable metallic layer 30, and the brazing promotion layer 40 can be used for enhancing the eutectic reaction and promote weldability.

Furthermore, the brazing promotion layer 40 can be made of an alloy that includes two or more metal elements, which can strengthen the eutectic reaction between the meltable metallic layer 30 and a brazing material, thereby increasing the bonding strength. In detail, the brazing promotion layer 40 can be made of an alloy composed of copper, nickel, and zinc, and the brazing promotion layer 40 is an extremely thin layer formed on the meltable metallic layer 30 by rolling. Specifically, the brazing promotion layer 40 is an extremely thin layer formed on the meltable metallic layer 30 by rolling and has a thickness of 5 μm or less (0.005 mm), so that the brazing promotion layer 40 can be used for enhancing the eutectic reaction, promote weldability, and reduce interface thermal resistance.

In other embodiments, the brazing promotion layer 40 may also be an extremely thin layer formed on the meltable metallic layer 30 by physical vapor deposition (PVD).

Third Embodiment

Figure 3:
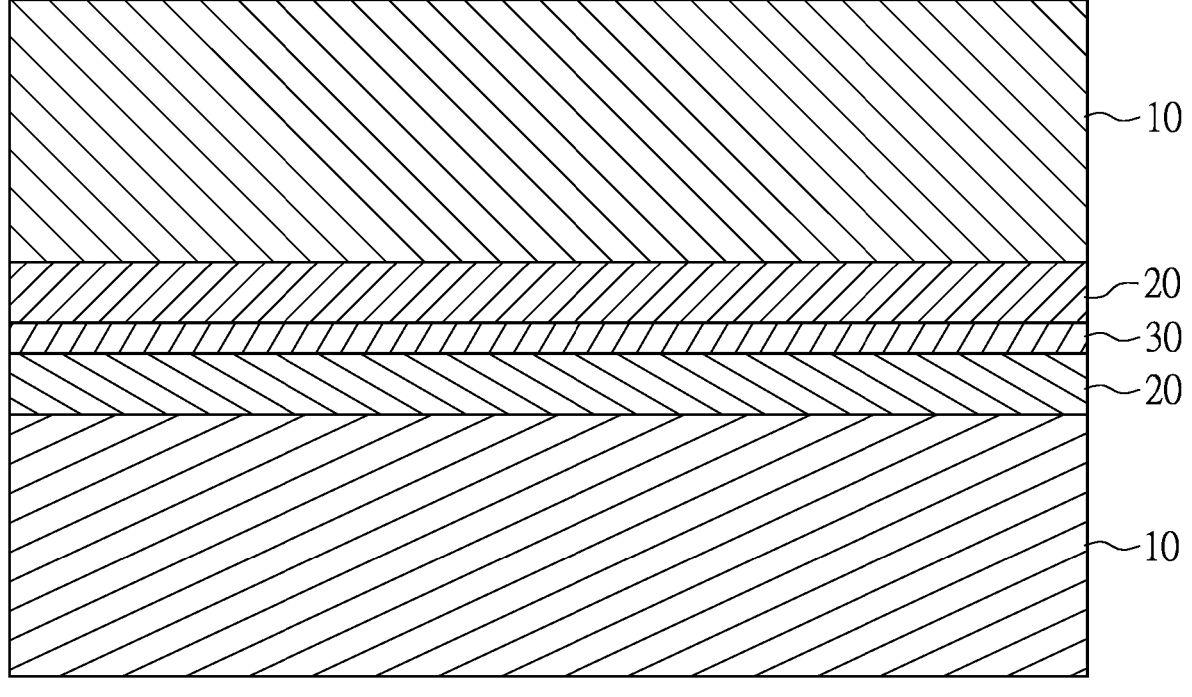
FIG. 3 is a schematic side view showing a surface-modified aluminum alloy substrate structure being bonded to another surface-modified aluminum alloy substrate structure according to a third embodiment of the present disclosure.

Reference is made to FIG. 3, which shows the third embodiment of the present disclosure. The present embodiment is substantially the same as the first embodiment, and the differences are explained as follows.

In the present embodiment, a modified surface of the surface-modified aluminum alloy substrate structure may be bonded to a modified surface of another surface-modified aluminum alloy substrate structure.

Beneficial Effects of the Embodiments

In conclusion, in the surface-modified aluminum alloy substrate structure provided by the present disclosure, by virtue of "a 6000-Series aluminum alloy substrate," "a diffusion buffer layer formed on the 6000-Series aluminum alloy substrate for buffering magnesium in the 6000-Series aluminum alloy substrate from diffusing to a meltable metallic layer," and "a meltable metallic layer formed on the diffusion buffer layer for being melted in a subsequent process," the surface-modified aluminum alloy substrate structure not only has sufficient strength, but also has good weldability without needing to additionally apply the filler and the flux.

In addition, in the surface-modified aluminum alloy substrate structure provided by the present disclosure, surface-modified aluminum by virtue of "a brazing promotion layer formed on the meltable metallic layer for enhancing a eutectic reaction," the eutectic reaction between the surface-modified aluminum alloy substrate structure and the brazing material can be strengthened, so as to enhance the bonding strength.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A surface-modified aluminum alloy substrate structure, comprising:
   a 6000-Series aluminum alloy substrate;
   a diffusion buffer layer formed on the 6000-Series aluminum alloy substrate for buffering magnesium in the 6000-Series aluminum alloy substrate from diffusing to a meltable metallic layer;

a meltable metallic layer formed on the diffusion buffer layer for being melted in a subsequent process; and
   a brazing promotion layer formed on the meltable metallic layer for enhancing a eutectic reaction; wherein the brazing promotion layer is made of an alloy that includes copper, nickel, and zinc.

2. The surface-modified aluminum alloy substrate structure according to claim 1, wherein the diffusion buffer layer is made of one of a 3000-Series aluminum alloy and a 1000-Series aluminum alloy.

3. The surface-modified aluminum alloy substrate structure according to claim 2, wherein the diffusion buffer layer is a thin layer formed on the 6000-Series aluminum alloy substrate by rolling and has a thickness of 1 mm or less.

4. The surface-modified aluminum alloy substrate structure according to claim 1, wherein the meltable metallic layer is an aluminum-silicon alloy layer.

5. The surface-modified aluminum alloy substrate structure according to claim 4, wherein the meltable metallic layer is a thin layer formed on the diffusion buffer layer by rolling and has a thickness of 0.3 mm or less.

6. The surface-modified aluminum alloy substrate structure according to claim 1, wherein the brazing promotion layer is an extremely thin layer formed on the meltable metallic layer by rolling and has a thickness of 0.005 mm or less.

7. The surface-modified aluminum alloy substrate structure according to claim 1, wherein the brazing promotion layer is an extremely thin layer formed on the meltable metallic layer by physical vapor deposition and has a thickness of 0.005 mm or less.

* * * * *